US009935558B2

United States Patent
Nakazawa et al.

(10) Patent No.: US 9,935,558 B2
(45) Date of Patent: Apr. 3, 2018

(54) DC-DC CONVERTER APPARATUS INCLUDING SINGLE DRIVE CIRCUIT BOARD ARRANGED AT PREDETERMINED INTERVAL FROM METAL BASE

(71) Applicant: Hitachi Automotive Systems, Ltd., Hiachinaka-shi, Ibaraki (JP)

(72) Inventors: Tatsuya Nakazawa, Hitachinaka (JP); Yuji Sobu, Hitachinaka (JP); Hidenori Shinohara, Hitachinaka (JP); Yoshiharu Yamashita, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 53 days.

(21) Appl. No.: 15/027,388

(22) PCT Filed: Oct. 1, 2014

(86) PCT No.: PCT/JP2014/076241
§ 371 (c)(1),
(2) Date: Apr. 5, 2016

(87) PCT Pub. No.: WO2015/053141
PCT Pub. Date: Apr. 16, 2015

(65) Prior Publication Data
US 2016/0248333 A1    Aug. 25, 2016

(30) Foreign Application Priority Data

Oct. 7, 2013    (JP) .................................. 2013-210128

(51) Int. Cl.
*H02M 3/335*    (2006.01)
*B60L 1/00*    (2006.01)
(Continued)

(52) U.S. Cl.
CPC ........... *H02M 3/33569* (2013.01); *B60L 1/00* (2013.01); *H02M 1/32* (2013.01); *H02M 3/00* (2013.01);
(Continued)

(58) Field of Classification Search
CPC .... H02M 2001/327; H02M 3/22; H02M 3/24; H02M 3/28; H02M 3/325; H02M 3/335; H02M 7/003; H05K 7/1432; H05K 7/2039
See application file for complete search history.

(56) References Cited

U.S. PATENT DOCUMENTS 5,373,418 A * 12/1994 Hayasi ................. H02M 7/003
                                               361/809
5,926,373 A    7/1999 Stevens
(Continued)

FOREIGN PATENT DOCUMENTS

EP    1 182 768 A2    2/2002
JP    6-276737 A    9/1994
(Continued)

OTHER PUBLICATIONS

International Search Report (PCT/ISA/210) issued in PCT Application No. PCT/JP2014/076241 dated Jan. 6, 2015 with English-language translation (four (4) pages).
(Continued)

*Primary Examiner* — Jue Zhang
*Assistant Examiner* — Jye-June Lee
(74) *Attorney, Agent, or Firm* — Crowell & Moring LLP

(57) ABSTRACT

To achieve reduction in size and reduction in cost of a DC-DC converter apparatus. Rectifier elements and are installed onto a metal base, and a drive circuit board is installed to an upper part of the rectifier element. Each terminal of the rectifier elements and is soldered to the drive
(Continued)

circuit board. Three terminals of the rectifier elements are soldered, respectively, to a drive signal wiring pattern, a high-potential-side main current wiring pattern, and a low-potential-side main current wiring pattern of the board. A pair of output terminals of a transformer is connected to at least the pair of high-potential-side main current wiring patterns using high-potential-side metal conductors.

3 Claims, 5 Drawing Sheets

(51) Int. Cl.
    *H02M 3/00*    (2006.01)
    *H02M 1/32*    (2007.01)
    *H05K 7/20*    (2006.01)
    *H05K 7/14*    (2006.01)
    *H05K 7/02*    (2006.01)

(52) U.S. Cl.
    CPC ...... *H02M 3/33592* (2013.01); *H05K 7/1432* (2013.01); *H05K 7/2039* (2013.01); *B60L 2210/12* (2013.01); *H02M 2001/327* (2013.01); *Y02T 10/7233* (2013.01)

(56) References Cited

U.S. PATENT DOCUMENTS

| | | | |
|---|---|---|---|
| 2001/0040812 A1* | 11/2001 | Jitaru | H02M 7/003 363/21.06 |
| 2004/0190318 A1 | 9/2004 | Tsuchiya et al. | |
| 2005/0083665 A1 | 4/2005 | Nakashima et al. | |
| 2006/0092599 A1* | 5/2006 | Yamamura | H05K 1/0263 361/611 |
| 2013/0021749 A1* | 1/2013 | Nakajima | H02M 7/003 361/689 |

FOREIGN PATENT DOCUMENTS

| | | |
|---|---|---|
| JP | 11-163566 A | 6/1999 |
| JP | 2005-184883 A | 7/2005 |
| JP | 2011-50160 A | 3/2011 |
| JP | 2013-34272 A | 2/2013 |
| JP | 2013-34273 A | 2/2013 |
| JP | 2013-150414 A | 8/2013 |
| JP | 2013-188010 A | 9/2013 |

OTHER PUBLICATIONS

Japanese-language Written Opinion (PCT/ISA/237) issued in PCT Application No. PCT/JP2014/076241 dated Jan. 6, 2015 (three (3) pages).

Japanese Office Action issued in counterpart Japanese Application No. 2015-541537 dated Mar. 28, 2017 with unverified English translation (seven pages).

Extended European Search Report issued in counterpart European Application No. 14851946.5 dated May 31, 2017 (7 pages).

\* cited by examiner

DC-DC CONVERTER APPARATUS INCLUDING SINGLE DRIVE CIRCUIT BOARD ARRANGED AT PREDETERMINED INTERVAL FROM METAL BASE

TECHNICAL FIELD

The present invention relates to a DC-DC converter apparatus.

BACKGROUND ART

A vehicle, such as a hybrid vehicle, a plug-in hybrid vehicle, and an electric car, is provided with a high-voltage storage battery for power driving, an inverter device configured to perform power conversion of a DC high voltage output of the high-voltage storage battery into an AC high voltage output and drive a motor, a DC-DC converter apparatus configured to convert the DC high voltage output of the high-voltage storage battery into a DC low voltage output and perform power supply to a low voltage load such as a light or a radio of the vehicle, and a low-voltage storage battery as an auxiliary power source of the low voltage load being mounted thereon.

In general, the DC-DC converter apparatus is provided with a high-voltage switching circuit which converts a DC high voltage into an AC voltage, a transformer which insulates and converts the AC high voltage into an AC low voltage, a low-voltage rectifier circuit which converts the AC low voltage into a DC voltage, and an output terminal which outputs the voltage-converted voltage. The low-voltage rectifier circuit is provided with a choke coil and a smoothing capacitor element configured to smooth a DC output voltage. In addition, a filter circuit configured of a reactor and a capacitor is provided in order to reduce conduction noise to be output from the output terminal.

It has been desired to enhance the habitability in such a vehicle by increasing a proportion of an interior with respect to the entire capacity of the vehicle as much as possible. Thus, it has been desired to mount the inverter device or the DC-DC converter apparatus to a space, as small as possible, in an engine room or a trunk room other than a vehicle compartment, and the compact design is necessary. (For example, see PTL 1).

CITATION LIST

Patent Literature

PTL 1: Japanese Patent Application Laid-Open No. 2013-34272

SUMMARY OF INVENTION

Technical Problem

PTL 1, described above, discloses a structure in which a semiconductor element, rectifier element and the like are arranged at positions opposing a board, and are connected to each other via an insert bus bar configured for electrical connection. However, the semiconductor element and the insert bus bar are arranged at the positions opposing the board in the related art, and thus, it is difficult to reduce a mounting area although it is possible to reduce the area of the board.

Solution to Problem

A DC-DC converter apparatus of the present invention is provided with: a metal base; a transformer which is mounted to the metal base, is connected between a high-voltage circuit on a primary side including a plurality of switching elements and a low-voltage circuit on a secondary side including at least a pair of rectifier elements, and performs power conversion between a high voltage and a low voltage; a drive circuit board which is arranged to have a predetermined interval with respect to the metal base, and to which the high-voltage circuit and the low-voltage circuit are mounted; and at least a pair of high-potential-side metal conductors which connect a pair of output terminals on the secondary side of the transformer and high-potential-side terminals of at least the pair of rectifier elements of the low-voltage circuit. Further, at least a pair of drive signal wiring patterns configured to supply a drive signal to a drive signal terminal of at least the pair of rectifier elements S, at least a pair of high-potential-side main current wiring patterns configured to supply a main current to the high-potential-side terminals of at least the pair of rectifier elements, and at least a pair of low-potential main current wiring patterns configured to supply the main current to low-potential-side terminals of at least the pair of rectifier elements are formed in the drive circuit board. Further, at least the pair of rectifier elements are arranged in contact with the metal base to be capable of heat conduction, the pair of output terminals on the secondary side of the transformer 250 is connected to each one end of at least the pair of high-potential-side metal conductors, each other end of at least the pair of high-potential-side metal conductors is connected to at least the pair of high-potential-side main current wiring patterns, and the high-potential-side terminals of at least the pair of rectifier elements are connected to at least the pair of high-potential-side main current wiring patterns.

Advantageous Effects of Invention

According to the present invention, the single drive circuit board is arranged to have the predetermined interval with respect to the metal base, the high-voltage switching circuit and the low-voltage rectifier circuit are mounted onto the drive board, and the high-voltage switching element and the low voltage the rectifier element are brought into contact with one surface of the metal base to be cooled, and accordingly, it is possible to achieve the miniaturization.

DESCRIPTION OF EMBODIMENTS

A DC-DC converter apparatus according to the present invention is used in an electric car, a plug-in hybrid vehicle, or the like. A high-voltage storage battery is mounted as a power source of a motor for driving to such a vehicle, and further, a low-voltage storage battery configured to operate an auxiliary machine such as a light or a radio is mounted thereto. The DC-DC converter apparatus is provided with a high-voltage switching circuit, a low-voltage rectifier circuit, and a transformer which connects these circuits to each other, and performs power conversion of a high voltage of the high-voltage storage battery into a low voltage, or power conversion of a low voltage of the low-voltage storage battery into a high voltage. The DC-DC converter apparatus of the present invention is reduced in size, particularly, by arranging a single insulating drive circuit board to have a predetermined interval with respect to a metal base, mounting the high-voltage switching circuit and the low-voltage rectifier circuit onto the drive board, and bringing the high-voltage switching element and the low voltage the rectifier element into contact with one surface of the metal base to be cooled. Hereinafter, an embodiment of the DC-DC converter apparatus of the present invention will be described with reference to the drawings.

[Circuit Configuration of DC-DC Converter Apparatus]

Figure 1:
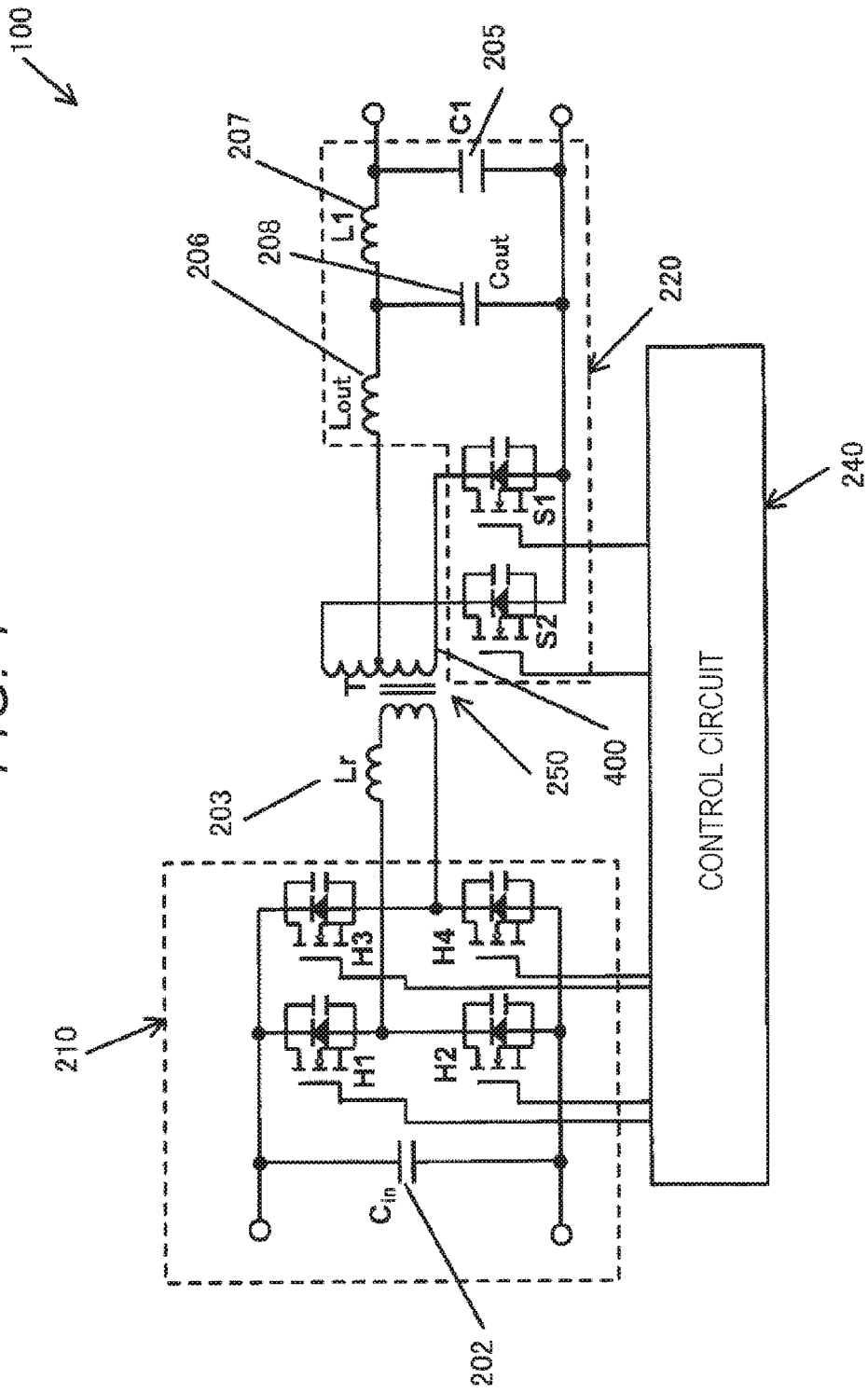
FIG. 1 is a diagram illustrating a main circuit of a DC-DC converter apparatus of an embodiment.

FIG. 1 is a circuit diagram of a DC-DC converter apparatus 100 of the present invention. This DC-DC converter apparatus 100 is provided with a high-voltage-side switching circuit (high-voltage-side circuit) 210 which converts a DC high voltage into an AC voltage, a transformer 250 which converts the AC high voltage to an AC low voltage, and a low-voltage-side rectifier circuit (low-voltage-side circuit) 220 which converts the AC low voltage into a DC voltage. The high-voltage-side switching circuit 210 and the low-voltage-side rectifier circuit 220 are switching-controlled by a control circuit 240.

A resonant coil 203(Lr) is connected between the high-voltage-side switching circuit 210 and the transformer 250, and zero-voltage switching of a MOSFET configuring the high-voltage-side switching circuit 210 becomes possible using a combined inductance of an inductance of this resonant coil 203 and a leakage inductance of the transformer 250.

A filter coil 207 (L1) and a filter capacitor 205 (C1) are provided on an output side of the low-voltage-side rectifier circuit 220 in order to remove noise superimposed on the output voltage. Incidentally, the resonant coil 203, the filter coil 207 and the filter capacitor 205 can be omitted.

(Circuit Configuration of High-Voltage-Side Switching Circuit)

The high-voltage-side switching circuit 210 is configured of four MOSFET's H1 to H4, connected as an H-bridge type, and a smoothing input capacitor 202(Cin). A snubber capacitor is provided in parallel to each of the MOSFET's H1 to H4. The AC voltage is generated on a primary side of the transformer 250 by performing phase-shift PWM control of the four MOSFET's H1 to H4 of the high-voltage-side switching circuit 210.

(Circuit Configuration of Low-Voltage-Side Rectifier Circuit)

The low-voltage-side rectifier circuit 220 includes two rectification phases configured using MOSFET's S1 and S2, and a smoothing circuit configured using a choke coil 206 (Lout) and a smoothing capacitor 208 (Cout). High-potential-side wirings of the respective rectification phases, that is, drain-side wirings of the MOSFET's S1 and S2 are connected to coil terminals 251 and 252 on a secondary side of the transformer 250 (see FIG. 4). A center tap terminal 253 (see FIG. 4) on the secondary side of the transformer 250 is connected to the choke coil 206(Lout), and the smoothing capacitor 208(Cout) is connected to an output side of the choke coil 206(Lout). In addition, the smoothing circuit, configured of the filter coil 207(L1) and the filter capacitor 205(C1), is also provided in the low-voltage-side rectifier circuit 220.

Incidentally, FIG. 1 illustrates the two MOSFET's S1 and S2 as the rectifier element for convenience. FIGS. 2 to 5, which will be described later, illustrate six MOSFET's as the rectifier element. The number of MOSFET's is appropriately defined upon design.

In FIG. 1, wirings 402A and 402B (see FIG. 4), which connect each of drain-side wirings of the MOSFET's S1 and S2 and each of coil force terminals 251 and 252 on the secondary side of the main transformer 250, are configured using a member 400 called an insert bus bar as will be described later. This insert bus bar 400, as will be described later, is arranged on a front surface of the drive circuit board 300, and have a protrusion, provided to protrude to a rear surface side, being electrically connected to each drain terminal and each source terminal of the low voltage the rectifier elements S1 and S2 pressed and fixed to a front surface of the metal base 10.

Incidentally, the DC-DC converter apparatus 100 can be provided with an active clamp circuit configured to suppress a surge voltage which is applied to the MOSFET's S1 and S2 of the low-voltage-side rectifier circuit 220. The active clamp circuit is provided with an active clamp MOSFET and an active clamp capacitor.

[Overall Structure of DC-DC Converter Apparatus 100]

Figure 2:
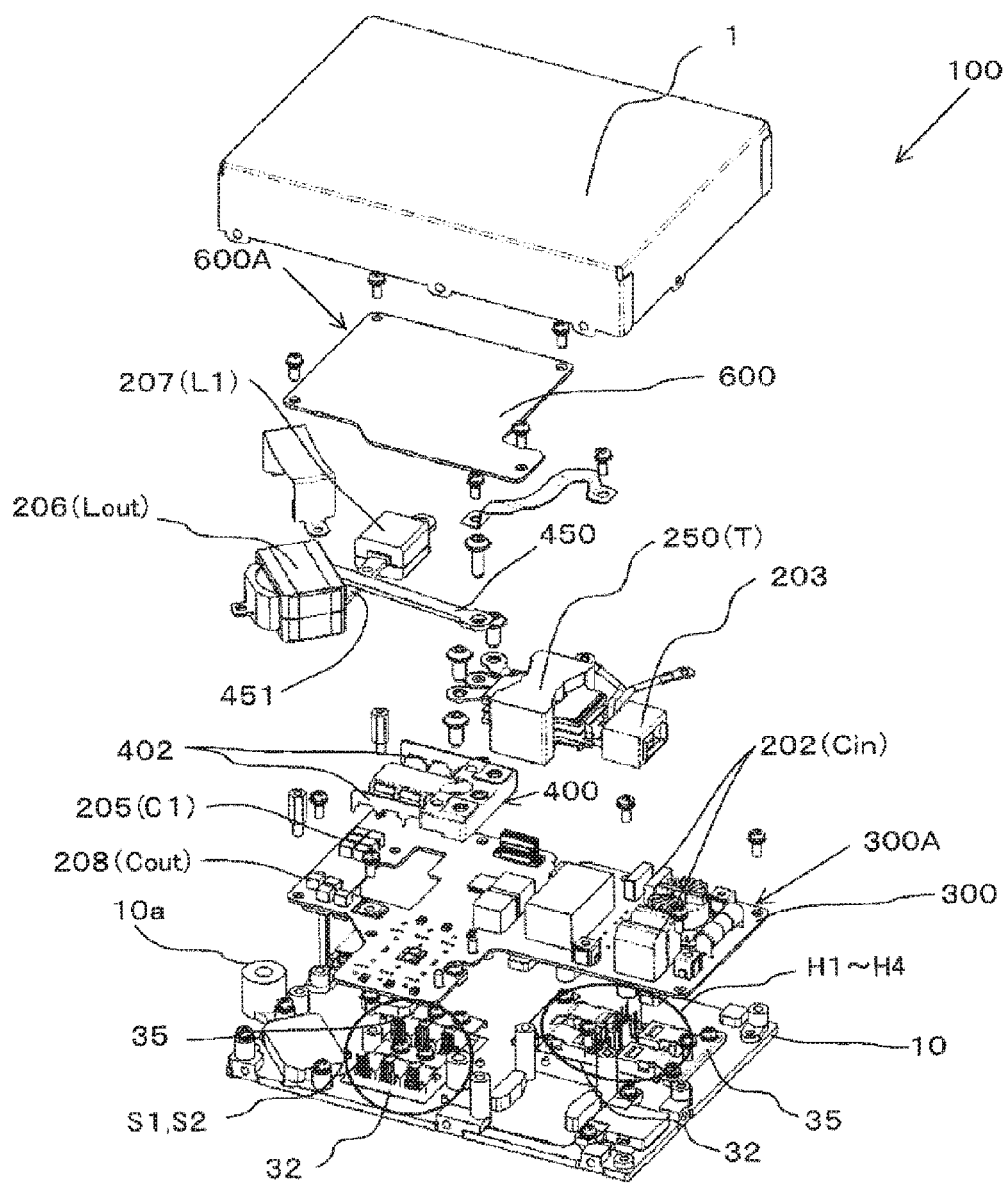
FIG. 2 is an exterior exploded perspective view of the DC-DC converter apparatus of the embodiment.
Figure 3:
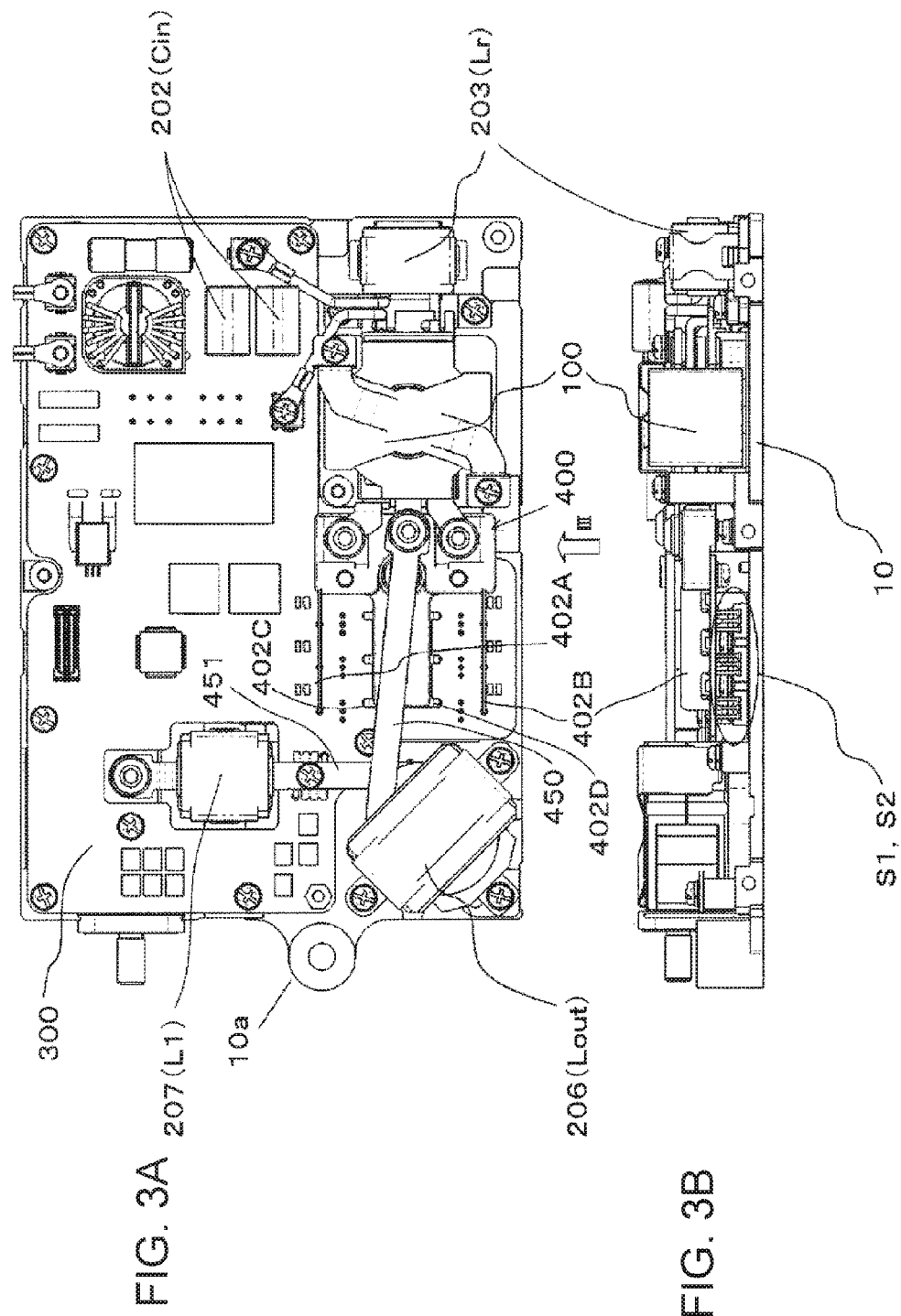
FIG. 3A is a plan view of an exemplary embodiment of the DC-DC converter apparatus of FIG. 2.
FIG. 3B is a side view thereof seen from an arrow III direction.

The overall structure of DC-DC converter apparatus 100 will be described with reference to FIGS. 2, 3(a) and 3(b). FIG. 2 is an exploded perspective view of the DC-DC converter apparatus 100 illustrated in FIG. 1, and FIGS. 3(a) and 3(b) are diagrams illustrating the arrangement of component parts of the DC-DC converter apparatus 100 illustrated in FIG. 2.

The DC-DC converter apparatus 100 is provided with a metal base 10, which has a rectangular shape and made of metal, for example, aluminum die casting, and the members configuring a DC-DC converter circuit, which have been described in FIG. 1, are attached onto the metal base 10. These members are covered by a top cover 1. A high-voltage/low-voltage circuit board assembly 300A, the transformer 250, the resonant coil 203, the choke coil 206, and a control circuit board assembly 600A are attached to the metal base 10.

A GND terminal 10a to connect a GND-side terminal of low voltage output is molded in the metal base 10 in an integrated manner. In addition, a high voltage connector (not illustrated) to input the high voltage, a signal connector (not illustrated) to connect an external electrical component and a signal or the like, and an output terminal (not illustrated) to output the low voltage output are attached to the exterior of the metal base 10.

Although not illustrated, a cooling unit is attached to a bottom surface of the metal base 10 via a seal member such as an O-ring. A cooling channel is provided in the cooling unit, and a heat generating part inside the DC-DC converter apparatus 100 is cooled by coolant flowing in this cooling channel. In general, a mixture of antifreeze and water at a ratio of 1:1 is suitable as the coolant, and another coolant can be also used. The cooling device to cool the DC-DC converter apparatus 100 has been described as an embodiment, and there is no harm in using another cooling device which uses a cooling gas such as air or the like.

The high-voltage/low-voltage circuit board assembly 300A is configured by mounting the component parts of the high-voltage-side switching circuit 210 and the component parts of the low-voltage-side rectifier circuit 220, which have been described in FIG. 1, to a drive circuit board 300 formed using a single glass epoxy board. That is, the high-voltage/low-voltage circuit board assembly 300A is configured by implementing the MOSFET's H1 to H4, the smoothing input capacitor 202, and an electronic part such as a gate resistance (not illustrated), which configure the high-voltage-side switching circuit 210, and the MOSFET's S1 and S2, a reactor 206, the smoothing capacitor 208 (Cout), the filter coil 207 and the filter capacitor 205 configuring the smoothing circuit, and an electronic part such as a gate resistance (not illustrated) which configure the low-voltage-side rectifier circuit 220. Each terminal of the MOSFET's H1 to H4, S1 and S2 is electrically connected to a circuit pattern of the drive circuit board 300 by soldering. The circuit pattern will be described later with reference to FIG. 4.

The MOSFET's H1 to H4, which serve as the switching elements mounted in a high-voltage circuit region of the drive circuit board 300, and the MOSFET's S1 and S2, which serve as the rectifier elements mounted in a low-voltage circuit region of the drive circuit board 300, are fixed in close contact with the metal base 10 using a leaf spring 35 via an insulating heat dissipation sheet 32 having a favorable thermal conductivity. The MOSFET is cooled by the coolant flowing in the cooling channel.

Incidentally, the MOSFET is pressed and fixed to the metal base 10 using the leaf spring 35, and has the terminal penetrating the drive circuit board 300 and protruding to the front surface of the drive circuit board 300. A wiring pattern is formed on the front surface of the drive circuit board 300, and the terminal penetrating the board is fixed to the circuit pattern by soldering.

The transformer 250, the choke coil 206, and the filter coil 207 are arranged on the metal base 10 in the state of being fixed by a fastening member. The metal base 10, the high-voltage/low-voltage circuit board assembly 300A, the control circuit board assembly 600A, the transformer 250, the choke coil 206, and the filter coil 207 are covered by the top cover 1 made of metal.

The control circuit board assembly 600A is configured by mounting a drive signal generation circuit, which generates a drive signal to drive the MOSFET's of the high-voltage-side switching circuit 210 and the low-voltage-side rectifier circuit 220 described in FIG. 1, onto a control circuit board 600 formed using a single glass epoxy board. The control circuit board assembly 600A is connected to a drive circuit of the drive circuit board assembly 300A via a direct connector. A flexible wiring board and a signal harness may also be used for the connection other than the direct connector.

FIG. 3(a) is a diagram of the mounting parts of the metal base 10 seen from above, and FIG. 3(b) is a side view thereof seen from a side. In this specification, the insert bus bar 400, the choke coil 206, and the filter capacitor 207, which configure the low-voltage rectifier circuit 220, are particularly called mounting parts on a first surface side of the drive circuit board 300. In addition, the MOSFET's S1 and S2, which are the low-voltage-side rectifier elements, are called mounting parts on a second surface side of the drive circuit board 300. The mounting parts on the second surface side are arranged in close contact with the metal base 10, and all the parts are hierarchically arranged on a lateral side of the main transformer 250. In other words, the drive circuit board 300 is arranged above the metal base 10 with a predetermined interval, and the MOSFET's S1 and S2 for rectification are arranged in close contact with the metal base 10 so as to form the low-voltage circuit region of the drive circuit board 300.

Figure 4:
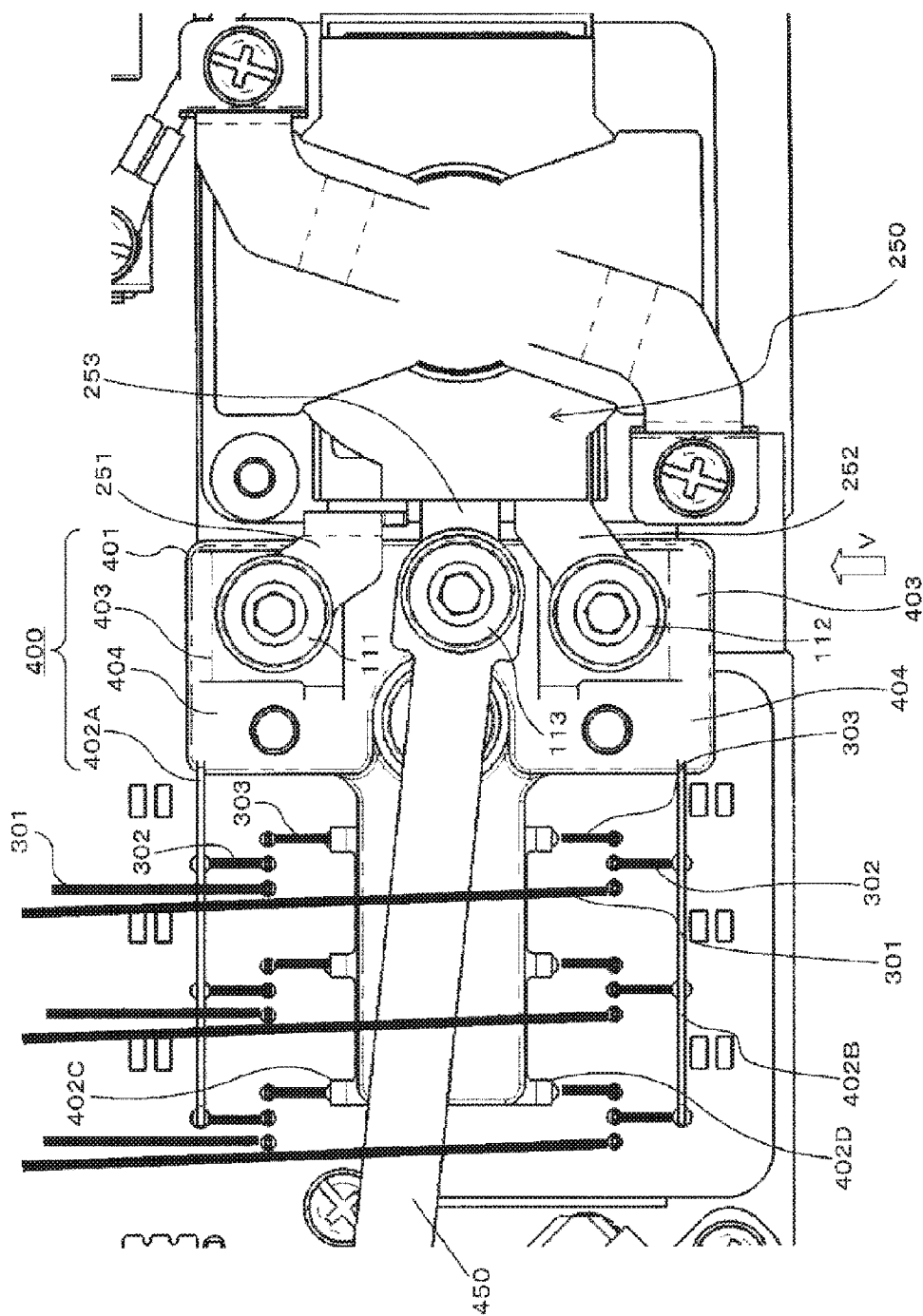
FIG. 4 is a plan view which enlarges a part of FIGS. 3A and 3B.
Figure 5:
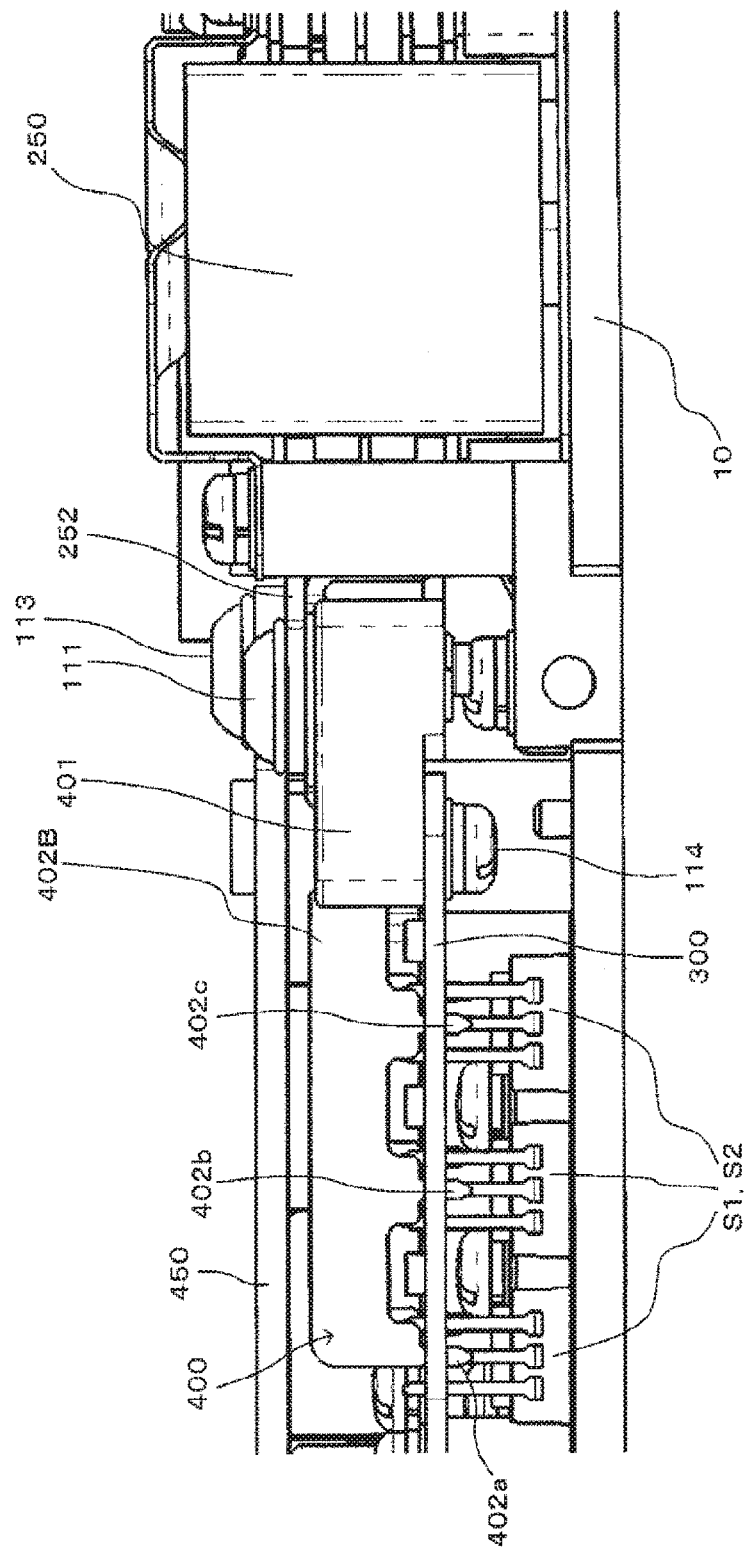
FIG. 5 is a side view which is seen from an arrow V direction of FIG. 4.

FIG. 4 is a plan view illustrating the vicinity of the insert bus bar 400 and the main transformer 250 of FIGS. 3(a) and 3(b) in an enlarged manner, and FIG. 5 is a side view which is seen from an arrow V direction of FIG. 4.

As described above with reference to FIG. 1, the two coil terminals 251 and 252 on the secondary side of the main transformer 250 and the respective high-potential-side drain terminals of the MOSFET's S1 and S2 as the rectifier elements are connected to each other via the insert bus bar 400. The insert bus bar 400 is manufactured by molding the two high-potential-side metal conductors 402A and 402B to be connected, respectively, to the two terminals 251 and 252 of the main transformer 250 in an integrated manner using resin.

The insert bus bar 400 includes a base portion 401 made of resin, and the two strip-like high-potential-side metal conductors 402A and 402B, which are molded with the base portion 401 using resin and protrude from the base portion 401. Planes of the two high-potential-side metal conductors 402A and 402B are arranged to oppose each other while being spaced with a predetermined distance. Protruding terminals 402a to 402c, which protrude toward the drive circuit board 300, are formed on lower end surfaces of the high-potential-side metal conductors 402A and 402B with a predetermined pitch. In addition, the insert bus bar 400 is molded with the base portion 401 using resin, and also includes two low-potential-side metal conductors 402C and 402D which are arranged to oppose the high-potential-side metal conductors 402A and 402B with a predetermined distance. Each of the low-potential-side metal conductors 402C and 402D has a ground potential.

As illustrated in FIG. 4, a wiring for the drive signal, that is, the first wiring pattern 301, that is, a wiring for the drive signal which transmits the drive signal to drive the MOSFET's S1 and S2 serving as the low-voltage rectifier elements, and wiring patterns for the main current, that is, the second wiring pattern 302 and the third wiring pattern 303 which transmit the main current to the MOSFET's S1 and S2 are provided in the drive circuit board 300. The first wiring pattern 301 is connected to each gate terminal of the MOSFET's S1 and S2. The second wiring pattern 302 is connected to each drain terminal of the MOSFET's S1 and S2, and the third wiring pattern 303 is connected to each source terminal of the MOSFET's S1 and S2.

The protrusions 402a to 402c of the insert bus bar 400 are inserted into through-holes of the drive circuit board 300 and are electrically connected to the high-voltage wiring pattern 302 formed in the drive circuit board 300 by soldering, and accordingly, the coil terminal 251 of the main transformer 250 are connected to the drain terminals of the MOSFET's S1 and S2. The predetermined pitch of the through-holes of the drive circuit board 300 and the terminals 402a to 402c of the insert bus bar 400 is the same value as an arrangement pitch of the MOSFET's serving as the rectifier element.

As illustrated in FIGS. 4 and 5, the insert bus bar 400 also includes connection terminals 403 and 404 which are exposed from the molded resin of the base portion 401. The two coil terminals 251 and 252 of the main transformer 250 are fastened to the connection terminal 403 using bolts 111 and 112 The center tap terminal 252 of the main transformer 250 and the bus bar 450, which connects the center tap terminal 253 to the choke coil 206, are fastened together by a bolt 113. The bus bar 450 transversely extends toward the choke coil 206 on the front surface of the drive circuit board 300 while being spaced with a predetermined distance. The other end of the bus bar 450 is connected to an input terminal of the choke coil 206. An output terminal of the choke coil 206 is connected to the filter coil 207 via the bus bar 451.

A metal fixing plate 404, in which a screw hole for fixing of the insert bus bar 400 is formed, is also exposed to the base portion 401. The insert bus bar 400 is arranged on the front surface of the drive circuit board 300, that is, the first surface, and is fixed to the drive circuit board 300 by allowing the bolt 114 to penetrate from the second surface side to be screwed to the metal fixing plate 404.

One gate terminal for the drive signal and the two terminals for the main current (the drain terminal and the source terminal) included in each of the MOSFET's S1 and S2 penetrate the drive circuit board 300 as described above. The first wiring pattern 301, that is, the low-voltage circuit pattern, which is formed in the drive circuit board 300 is electrically connected to each terminal of the MOSFET's penetrating the top surface through the terminal throughhole by soldering. In addition, the high-potential-side pattern of the main current circuit pattern, which is formed in the drive circuit board 300, is connected to the drain terminal, and the low-potential-side pattern of the main current circuit pattern is connected to the source terminal by soldering. The protruding terminal of the insert bus bar 400 is electrically connected to the high-potential-side pattern and the low-potential-side pattern of the main current circuit pattern formed in the drive circuit board 300 by soldering.

As above, the two terminals 251 and 252 of the main transformer 250 and the drain terminals of the MOSFET's S1 and S2 serving as the rectifier elements are connected to each other using the wiring pattern 302 of the high voltage side of the main current on the circuit board 300 and the insert bus bar 400 in the DC-DC converter apparatus 100 of the embodiment. The source terminals of the MOSFET's S1 and S2 are connected to each other via the wiring pattern 303 of the low potential side of the main current on the circuit board 300 and the insert bus bar 400.

Incidentally, although not illustrated in FIG. 4, a wiring pattern for a drive signal, which transmits a drive signal to drive the MOSFET's H1 to H4 serving as the high-voltage switching elements, and a high-potential-side wiring pattern and a low-potential-side wiring pattern for a main current which transmit the a main current to the MOSFET's H1 to H4 are also formed in the drive circuit board 300. Further, similarly to the low-voltage-side rectifier element, three terminals provided in each of the MOSFET's H1 to H4 penetrate the drive circuit board 300, and are electrically connected to the circuit pattern of the drive board 300 by soldering as described above.

As described above, the following operational effects are obtained according to the DC-DC converter apparatus 100 of the embodiment.

(1) In the DC-DC converter apparatus 100, the high-voltage circuit 210 and the low-voltage circuit 220 are mounted to the drive circuit board 300, and the drive circuit board 300 is arranged above the metal base 10. Further, at least the pair of rectifier elements S1 and S2 is arranged in close contact with the metal base 10 below the drive circuit board 300. According to the DC-DC converter apparatus 100 of the embodiment configured as above, it is possible to decrease an installation area, and to achieve reduction in cost through reduction in the number of parts. In addition, it is possible to achieve the improvement of assembling workability through the integration of the board.

In the case of adopting a structure in which a low-voltage circuit board and a high-voltage circuit board are divided, a metal substrate is used for the low-voltage circuit board, and a bus bar on the metal substrate is used for a rectifier element, which rectifies current on a secondary side of a transformer, to transmit a drive signal, there is a problem that the cost increases due to the use of an expensive metal substrate, and an increase in the number of parts of the bus bars.

(2) The transformer 250 is installed to the metal base 10, and the drive circuit board 300 is arranged at a position lower than a maximum height of the transformer 250. Accordingly, it is possible to restrict the overall height of the DC-DC converter apparatus 100 with a height of a part having a high height such as the transformer 250, and it is possible to reduce the volume of the DC-DC converter apparatus 100 in combination with the effect of decreasing the installation area.

(3) The respective drain terminals on the high potential side of the main current of at least the pair of rectifier elements S1 and S2 are connected to the two coil terminals 251 and 252 on the secondary side of the transformer via at least a pair of the high-potential-side metal conductors 402A and 402B from at least a pair of the second wiring patterns 302 for the main current on the high potential side. Accordingly, it is possible to reduce the number of the bus bars.

(4) One ends of the high-potential-side metal conductors 402A and 402B are integrated with the base portion 401 using a resin mold having an insulation property. The mounting parts which require a certain insulation distance are interspersed on the first surface side of the drive circuit board 300 on which the insert bus bar 400 is arranged. In general, it is necessary to secure the spatial distance with respect to the mounting parts in the case of arranging the bus bar, and accordingly, the board mounting area increases in some cases. According to the embodiment, the insulation through the resin is possible, and thus, the request for consideration of the insulation distance with respect to the board the mounting parts is relieved, a degree of freedom increases in the layout of the mounting parts, and it is possible to reduce the size of the board by reducing the board mounting area.

(5) The low-potential-side terminals of at least the pair of rectifier elements S1 and S2 are fixed to the metal base 10 having the ground potential using the low-potential-side metal conductors 402C and 402D from the third wiring pattern 303 for the main current on the low potential side. The bus bar is unnecessary also in this case, which contributes to the reduction in the number of parts and the cost reduction.

(6) One ends of at least the pair of low-potential-side metal conductors 402C and 402D are molded to the base portion 401 using resin. Accordingly, unintentional discharge is prevented among the parts and members to be mounted to the drive circuit board 300, and the degree of freedom in the arrangement of parts to be mounted to the drive circuit board 300 is enhanced, which makes the design easy and contributes to the reduction in size.

(7) Since the plurality of high-potential-side metal conductors 402A and 402B are molded in an integrated manner by the resin molding, the assembling workability is improved. Similarly, each base portion of the low-potential-side metal conductors 402C and 402D is also integrated by the resin molding. In a case in which the plurality of metal conductors 402A, 402B, 402C and 402D are provided as different parts, it is necessary to mount the respective metal conductors to the board. However, it is possible to form a sub-assembly part of the respective metal conductors when the metal conductors 402A to 402D, which have been integrated with the base portion 401 using resin, are secured to the drive circuit board 300 using the screw and fixed only by the soldering as in the embodiment, and it is possible to simplify a board manufacturing process. Further, it is possible to perform soldering including the bus bar wiring at the time of sub-assembly of the board, and thus, it is possible to improve the production efficiency in a final assembly process.

(8) The high-potential-side terminals of the main current of the rectifier elements S1 and S2 are connected to the coil terminals 251 and 252 on the secondary side of the transformer using the high-potential-side metal conductors 402A and 402B from the second wiring pattern 302 for the main current on the high potential side. The low-potential-side terminals of the main current of the rectifier elements are fixed to the metal base 10 having the ground potential using the low-potential-side metal conductors 402C and 402D from the third wiring pattern 303 for the main current on the low potential side. Accordingly, it is possible to reduce the number of the bus bars, which contributes to cost reduction.

(9) The pitch of the protrusions 402a to 402c of the high-potential-side metal conductors 402A and 402B is set to match with the arrangement pitch of the rectifier element. Accordingly, it is possible to configure the shortest board pattern, to achieve the reduction in size of the board, and to effectively utilize the capacity, thereby enabling the reduction in size of the product. The low-potential-side metal conductors 402C and 402D also having the same protrusions with the same pitch, and thus, it is possible to obtain the same effect.

(10) As the component parts has the hierarchical arrangement structure by arranging the metal conductors 402A to 402D on the first surface, that is, the front surface of the drive circuit board and arranging the rectifier elements on the second surface side, that is, the rear surface side which is the opposite side of the first surface, the component parts can be accommodated within a positional height of the transformer, which has a high mounting height among the electronic parts, and the overall height of the device is suppressed, and thus, it is possible to provide the DC-DC converter apparatus which is reduced in size.

(11) Further, when the drive circuit board 300 is used, the drive signal transmitted on the metal substrate is connected to the first wiring pattern 301, which transmits the drive signal using the pattern on the wiring board, and the second wiring pattern 302 and the third wiring pattern 303 which transmit the main current to the rectifier element. Accordingly, it is possible to abolish the bus bar on the metal substrate, and further, to cause the low-voltage rectifier circuit 220 to be integrated with the drive circuit board 300 together with the high-voltage switching circuit 210, thereby enabling the reduction in the manufacturing cost.

(12) The rectifier elements S1 and S2 are arranged in close contact with the metal base 10 on the lateral side of the region in which the transformer 250 of the metal base 10 is arranged, and are connected to the metal conductors 402A and 402B through the wiring pattern of the drive circuit board 300 above the rectifier elements S1 and S2. The bus bar 400 to be connected to the transformer 250 are connected to the drive circuit board 300 by soldering similarly to the rectifier element, and are connected to the transformer 250 across the side portion of the drive circuit board 300. In addition, the bus bar 400 is connected to the second wiring pattern 302, which is connected with the high-potential-side terminal of the rectifier element, on the drive circuit board 300. Accordingly, it is possible to form the wiring pattern and the bus bar on the board with the shortest length, and thus, it is possible to effectively utilize the capacity of the device.

Incidentally, the following disadvantage has been found out in the case of using an aluminum printed board, that is, the metal substrate as the low-voltage circuit board and using a cheap glass/epoxy printed board as the high-voltage board. That is, a terminal block with the built-in bus bar is used for connection between the transformer and the low-voltage circuit. Thus, the rectifier element and the wiring to transmit the drive signal are configured to have a structure in which the transmission is allowed using the connection between the terminal block and the bus bar on the metal substrate (through soldering or welding, for example), or using the pattern, but, the cost has increased due to the use of the aluminum board and the increase in the number of parts including the terminal block.

The DC-DC converter apparatus of the embodiment can be modified and implemented as follows.

(1) Although the insert bus bar 400 is fixed to the drive circuit board 300 using the screw 114, an arbitrary fixing method may be used as long as the mechanical fixation is possible. For example, the resin portion of the insert bus bar 400 is formed to include a protrusion shape and may be fixed with the board by heat welding. Alternatively, a connection mode using welding or soldering, for example, may be adopted as long as it is possible to electrically connect the insert bus bar 400 and the transformer 250.

(2) Although there is no limit on a method regarding the soldering of the insert bus bar 400, it is desirable to perform reflow soldering on the second surface together with the other mounting parts to be mounted onto the first surface, which is the front surface of the drive circuit board 300, from a point of view of the simplification of the process.

(3) Although the resin with high heat resistance (for example, PPS) is used as the resin used for the insert bus bar of the present embodiment, a cheap resin with low heat resistance may be used in a case in which the temperature of the bus bar does not rise to high temperature.

(4) The description has been given regarding the insert bus bar 400 with which the high-potential-side metal conductor, which connect the pair of output terminals 251 and 252 of the transformer 250 and the high-potential-side terminals for the main current of the rectifier elements, is molded using the resin. However, each of the metal conductors 402A and 402B of the present invention may be provided as a single body without being subjected to the resin molding. The low-potential-side metal conductors 402C and 402D may be configured in the same manner as above.

(5) The description has been given so far regarding the insert bus bar 400 with which the high-potential-side metal conductor and the low-potential-side metal conductor are integrated by the resin molding. However, each of the high-potential-side metal conductor, which has been integrated by the resin molding, and the low-potential-side metal conductor, which has been integrated by the resin molding, may be mounted to the drive circuit board 300 as different bodies.

(6) The description has been given in the embodiment such that the low-voltage rectifier circuit 220 includes the pair of rectifier elements S1 and S2 while using the pair of high-potential-side metal conductors 402A and 402B and the pair of low-potential-side metal conductors 402C and 402D correspondingly. The number of the rectifier elements is not limited to the pair, and the number of the corresponding metal conductors is not limited to the pair, either.

The above description is mere an example, and the present invention is not limited to the above-described embodiment. The present invention can be applied to various modes of the DC-DC converter apparatus configured to achieve the reduction in size by mounting the high-voltage switching circuit and the low-voltage rectifier circuit to the single drive circuit board, arranging the drive circuit board with the predetermined interval above the metal base in which the transformer is installed, and arranging the rectifier element mounted to the drive circuit board in close contact with the top of the metal base.

REFERENCE SIGNS LIST 1 top cover
10 metal base
10a GND terminal
S1, S2, H1 to H4 MOS-FET
32 insulating heat dissipation sheet
35 leaf spring
100 DC-DC converter apparatus
203 resonant coil
206 choke coil
210 high-voltage circuit
220 low-voltage circuit
240 control circuit
250 main transformer
251 high-potential-side terminal
252 low-potential-side terminal
253 center tap terminal
300 drive circuit board
300A drive circuit board assembly
301 drive signal wiring pattern
302, 303 main current wiring pattern
400 insert bus bar
401 base portion
402 metal conductor
402a to 402c protrusion
402A, 402B high-potential-side metal conductor
402C, 402D low-potential-side metal conductor
600 control circuit board
600A control circuit board assembly

The invention claimed is:

1. A DC-DC converter apparatus comprising:
a metal base;
a transformer which performs power conversion;
a rectifier element which controls input and output current of the transformer; and
a drive circuit board on which a drive circuit to drive the rectifier element is mounted,
wherein the rectifier element is arranged on the metal base to be capable of heat conduction, and
the drive circuit board is arranged to have a predetermined interval with respect to the metal base, the DC-DC converter apparatus further comprising:
a high-voltage circuit which includes a plurality of switching elements, and is connected to a primary side of the transformer;
a low-voltage circuit which includes the rectifier element, and is connected to a secondary side of the transformer; and
a high-potential-side metal conductor which connects an output terminal on the secondary side of the transformer and a high-potential-side terminal of the rectifier element,
wherein a drive signal wiring pattern configured to supply a drive signal to a drive signal terminal of the rectifier element, a high-potential-side main current wiring pattern configured to supply a main current to the high-potential-side terminal of the rectifier element, and a low-potential-side main current wiring pattern configured to supply the main current to a low-potential-side terminal of the rectifier element are formed in the drive circuit board,
the output terminal of the secondary side of the transformer is connected to one end of the high-potential-side metal conductor,
an other end of the high-potential-side metal conductor is connected to the high-potential-side main current wiring pattern,
the high-potential-side main current wiring pattern is connected to the high-potential-side terminal of the rectifier element, and
the one end of the high-potential-side metal conductor is integrated with a base portion by resin molding.

2. The DC-DC converter apparatus according to claim 1, wherein
the drive circuit board is arranged at a position lower than a maximum height of the transformer.

3. The DC-DC converter apparatus according to claim 1, wherein
the low-potential-side terminal of the rectifier element is connected to the low-potential main current wiring pattern formed in the drive circuit board,
an other end of a low-potential-side metal conductor is connected to the low-potential-side main current wiring pattern, and
one end of the low-potential-side metal conductor is fixed to the metal base having a ground potential.

* * * * *